(12) United States Patent
Morrow

(10) Patent No.: US 11,486,772 B1
(45) Date of Patent: Nov. 1, 2022

(54) TRANSDUCER ASSEMBLIES AND METHODS

(71) Applicant: STRESS ENGINEERING SERVICES, INC., Mason, OH (US)

(72) Inventor: Daniel L. Morrow, Batavia, OH (US)

(73) Assignee: STRESS ENGINEERING SERVICES, INC., Mason, OH (US)

(*) Notice: Subject to any disclaimer, the term of this patent is extended or adjusted under 35 U.S.C. 154(b) by 0 days.

(21) Appl. No.: 17/830,758

(22) Filed: Jun. 2, 2022

Related U.S. Application Data

(60) Provisional application No. 63/334,343, filed on Apr. 25, 2022.

(51) Int. Cl.
| | | |
|---|---|---|
| *G01L 1/12* | (2006.01) | |
| *G01L 5/04* | (2006.01) | |
| *F41B 5/10* | (2006.01) | |

(52) U.S. Cl.
CPC ............ *G01L 1/12* (2013.01); *G01L 1/122* (2013.01); *F41B 5/105* (2013.01); *G01L 5/04* (2013.01)

(58) Field of Classification Search
CPC ... G01L 1/12; G01L 1/122; G01L 5/04; F41B 5/105
See application file for complete search history.

(56) References Cited

U.S. PATENT DOCUMENTS

| | | |
|---|---|---|
| 3,097,624 A | 7/1963 | Bergquist |
| 3,866,592 A | 2/1975 | Carella |
| 4,134,383 A | 1/1979 | Flood |
| 4,169,456 A | 10/1979 | Van House |
| 4,179,613 A | 12/1979 | Koren |
| 4,368,719 A | 1/1983 | Christopher |
| 4,454,858 A | 6/1984 | Henry |
| 4,572,153 A | 2/1986 | Macpherson |
| 4,689,887 A | 9/1987 | Colvin |
| 4,741,320 A | 5/1988 | Wiard |
| 4,838,236 A | 6/1989 | Kudlacek |
| 4,926,832 A | 5/1990 | Darlington |

(Continued)

FOREIGN PATENT DOCUMENTS

| | | |
|---|---|---|
| CN | 201751798 U | 2/2011 |
| CN | 102706270 A | 10/2012 |

(Continued)

OTHER PUBLICATIONS

Nishizono, H. et al.; Analysis of Archery Shooting Techniques by Means of Electromyography; International Symposium on Biomechanics in Sports (1987); pp. 364-372.

(Continued)

*Primary Examiner* — Jonathan M Dunlap
(74) *Attorney, Agent, or Firm* — Ulmer & Berne LLP

(57) ABSTRACT

A transducer assembly includes a mounting base, a collar, a magnet, and a Hall effect sensor. The collar defines a bore and extends from a proximal end to a distal end. The proximal end is fixedly coupled with the mounting base. One of the magnet and the Hall effect sensor is disposed within the bore and fixedly coupled to the mounting base. The other of the magnet and the Hall effect sensor is fixedly coupled to the distal end of the collar. The Hall effect sensor is spaced longitudinally from the magnet and is configured to detect lateral deflection of the distal end of the collar. Methods are also provided.

24 Claims, 15 Drawing Sheets

(56) References Cited

U.S. PATENT DOCUMENTS

| | | | |
|---|---|---|---|
| 4,986,250 A | 1/1991 | Darlington | |
| 5,054,462 A | 10/1991 | Larson | |
| 5,060,626 A | 10/1991 | Elliott et al. | |
| 5,201,304 A | 4/1993 | Rezmer | |
| 5,205,268 A | 4/1993 | Savage | |
| 5,220,906 A | 6/1993 | Choma | |
| 5,243,957 A | 9/1993 | Neilson | |
| 5,277,170 A | 1/1994 | Carella | |
| 5,353,511 A | 10/1994 | Boll et al. | |
| 5,388,563 A | 2/1995 | Hsu | |
| 5,435,292 A | 7/1995 | Armstrong | |
| 5,479,712 A | 1/1996 | Hargrove et al. | |
| 5,782,229 A | 7/1998 | Evans et al. | |
| 5,881,705 A | 3/1999 | Howell et al. | |
| 5,934,265 A | 8/1999 | Darlington | |
| 5,954,041 A | 9/1999 | Sands | |
| 5,983,879 A | 11/1999 | Gifford | |
| 6,029,120 A | 2/2000 | Dilger | |
| 6,082,346 A | 7/2000 | Andrews et al. | |
| 6,082,347 A | 7/2000 | Darlington | |
| 6,155,244 A | 12/2000 | Mcclanahan | |
| 6,191,574 B1 | 2/2001 | Dilger | |
| 6,220,235 B1 | 4/2001 | Sands | |
| 6,618,949 B1 | 9/2003 | Keener | |
| 6,629,522 B2 | 10/2003 | Andrews | |
| 6,691,692 B1 | 2/2004 | Adkins | |
| 6,718,963 B1 | 4/2004 | Wheeler | |
| 6,873,406 B1 | 3/2005 | Hines et al. | |
| 6,990,970 B1 | 1/2006 | Darlington | |
| 7,086,298 B1 | 8/2006 | Colman | |
| 7,165,543 B2 | 1/2007 | Simo et al. | |
| 7,188,615 B2 | 3/2007 | Chang | |
| 7,328,693 B2 | 2/2008 | Kempf | |
| 7,337,773 B2 | 3/2008 | Simo et al. | |
| 7,513,050 B2 | 4/2009 | Kroening, Jr. | |
| 7,770,567 B1 | 8/2010 | Yehle | |
| 7,972,230 B2 | 7/2011 | Donahoe | |
| 8,096,059 B2 | 1/2012 | Stagg | |
| 8,186,339 B1 | 5/2012 | Mcclanahan | |
| 8,282,493 B2 | 10/2012 | Romn et al. | |
| 8,286,871 B2 | 10/2012 | Bay | |
| 8,316,551 B2 | 11/2012 | Gorsuch et al. | |
| 8,387,608 B2 | 3/2013 | Morris | |
| 8,528,535 B2 | 9/2013 | Morris | |
| 8,602,013 B2 | 12/2013 | Bednar et al. | |
| 8,683,989 B1 | 4/2014 | Mcpherson | |
| 8,733,168 B2 | 5/2014 | Donahoe et al. | |
| 8,819,983 B2 | 9/2014 | Tate | |
| 8,899,220 B2 | 12/2014 | Morris | |
| 8,931,466 B2 | 1/2015 | Immesberger et al. | |
| 8,971,959 B2 | 3/2015 | Hunt et al. | |
| 9,068,795 B2 | 6/2015 | Roman et al. | |
| 9,127,911 B2 | 9/2015 | Varshneya | |
| 9,435,605 B2 | 9/2016 | Mcpherson et al. | |
| 9,448,036 B2 | 9/2016 | Samuels et al. | |
| 9,970,730 B2 | 5/2018 | Thacker, Jr. | |
| 10,281,229 B2* | 5/2019 | Haynes | G01L 1/044 |
| 10,359,254 B1 | 7/2019 | Kempf et al. | |
| 10,627,185 B2* | 4/2020 | Marriott | F41B 5/123 |
| 10,712,119 B1 | 7/2020 | Clum et al. | |
| 10,852,095 B2* | 12/2020 | Haynes | F41B 5/123 |
| 11,143,483 B2* | 10/2021 | Marriott | F41B 5/1403 |
| 11,255,628 B2* | 2/2022 | Haynes | F41B 5/123 |
| 2004/0014010 A1 | 1/2004 | Swensen et al. | |
| 2004/0080491 A1* | 4/2004 | Takatsuka | G06F 3/0338 345/156 |
| 2005/0123883 A1 | 6/2005 | Kennen et al. | |
| 2006/0169260 A1 | 8/2006 | Chang | |
| 2007/0068270 A1 | 3/2007 | Coffey et al. | |
| 2007/0151552 A1 | 7/2007 | Czemske et al. | |
| 2010/0265176 A1* | 10/2010 | Olsson | G06F 3/016 345/161 |
| 2011/0277738 A1 | 11/2011 | Morris | |
| 2012/0256821 A1* | 10/2012 | Olsson | G06F 3/0338 345/156 |
| 2012/0274563 A1* | 11/2012 | Olsson | G05G 9/047 345/161 |
| 2013/0098344 A1 | 4/2013 | Morris | |
| 2013/0319135 A1* | 12/2013 | Okada | G01L 1/2206 73/862.043 |
| 2014/0366860 A1 | 12/2014 | Naki | |
| 2016/0033228 A1 | 2/2016 | Mcpherson | |
| 2016/0069643 A1 | 3/2016 | Lyren | |
| 2016/0327367 A1 | 11/2016 | Porter et al. | |
| 2018/0058961 A1 | 3/2018 | Dunham et al. | |
| 2018/0283820 A1 | 10/2018 | Bowers et al. | |
| 2019/0025004 A1 | 1/2019 | Thalberg | |
| 2020/0049446 A1 | 2/2020 | Thalberg | |
| 2021/0247249 A1* | 8/2021 | Lenzi | G01L 1/165 |

FOREIGN PATENT DOCUMENTS

| | | |
|---|---|---|
| CN | 203017728 U | 6/2013 |
| CN | 204421744 U | 6/2015 |
| CN | 104807373 A | 7/2015 |
| CN | 105627820 A | 6/2016 |
| CN | 205748114 U | 11/2016 |
| DE | 102010053506 A1 | 6/2012 |
| FR | 2562226 A1 | 10/1985 |
| GB | 2223102 A | 3/1990 |
| JP | H08178593 A | 7/1996 |
| KR | 10-2010-0136385 A | 12/2010 |
| KR | 101201941 B1 | 11/2012 |
| TW | 201018865 A | 5/2010 |
| WO | 2004104508 A2 | 12/2004 |
| WO | 2011010899 A2 | 1/2011 |
| WO | 2015148200 A1 | 10/2015 |

OTHER PUBLICATIONS

Gros, Hans J.; A Training and Feedback System for Archers; International Symposium on Biomechanics in Sports (1997); pp. 463-469.

Loke, Y.L. et al.; Smart system for archery using ultrasound sensors; 2009 IEEE/ASME International Conference on Advanced Intelligent Mechatronics; Singapore, Jul. 14-17, 2009; pp. 1160-1164.

Lancaster Archery Supply; product information for Sport Sensors Arrowspeed Radar Chronograph; product photo copyright date 2010; retrieved from http://www.lancasterarchery.com/sport-sensors-arrowspeed-radar-chronograp-h.hml; 3 pages.

Hamdan, S. et al.; A crossbow system for high-strain-rate mechanical testing; Measurement Science and Technology 7; Mar. 26, 1996; pp. 1068-1072.

Martin, Philip E. et al.; Archery Bow Grip Force Distribution: Relationships with Performance and Fatigue; International Journal of Sport Biomechanics, 1992, vol. 8; pp. 305-319.

* cited by examiner

TRANSDUCER ASSEMBLIES AND METHODS

REFERENCE TO RELATED APPLICATION

This application claims priority of U.S. provisional patent application Ser. No. 63/334,343 filed Apr. 25, 2022, entitled "Load Cells, Methods And Apparatus Having Same," and hereby incorporates this provisional patent application by reference herein in its entirety.

TECHNICAL FIELD

The transducer assemblies and methods described herein facilitate measurement of forces within a load path.

BACKGROUND

Conventional apparatus and methods for measurement of loads within a load path can exhibit a form factor, size, operation, and/or other configurational aspect(s) that render them ineffective for implementation within certain applications.

SUMMARY

In accordance with one embodiment, a transducer assembly includes a mounting base, a collar, a magnet, and a Hall effect sensor. The collar defines a bore and extends from a proximal end to a distal end. The proximal end is fixedly coupled with the mounting base. One of the magnet and the Hall effect sensor is disposed within the bore and fixedly coupled to the mounting base. The other of the magnet and the Hall effect sensor is fixedly coupled to the distal end of the collar. The Hall effect sensor is spaced longitudinally from the magnet and is configured to detect lateral deflection of the distal end of the collar.

In accordance with another embodiment, a method includes fixedly positioning a mounting base of a transducer assembly. The transducer assembly includes a magnet and a Hall effect sensor spaced longitudinally from the magnet. The method further includes providing power to the Hall effect sensor and routing a flexible cord in contact with and at least partially around a circumference of a collar of the transducer assembly. The collar defines a bore and extends from a proximal end to a distal end. The proximal end is fixedly coupled with the mounting base. One of the magnet and the Hall effect sensor is disposed within the bore and fixedly coupled to the mounting base. The other of the magnet and the Hall effect sensor is fixedly coupled to the distal end of the collar. The method further includes applying a load to the flexible cord, resulting in lateral deflection of the distal end of the collar. The method additionally includes detecting, by the Hall effect sensor, the lateral deflection of the distal end of the collar. The method also includes producing, by the Hall effect sensor, an electrical signal indicative of the lateral deflection of the distal end of the collar and, based upon the electrical signal, identifying the amount of the load applied to the flexible cord.

BRIEF DESCRIPTION OF THE DRAWINGS

It is believed that certain embodiments will be better understood from the following description taken in conjunction with the accompanying drawings in which.

DETAILED DESCRIPTION

Figure 1:
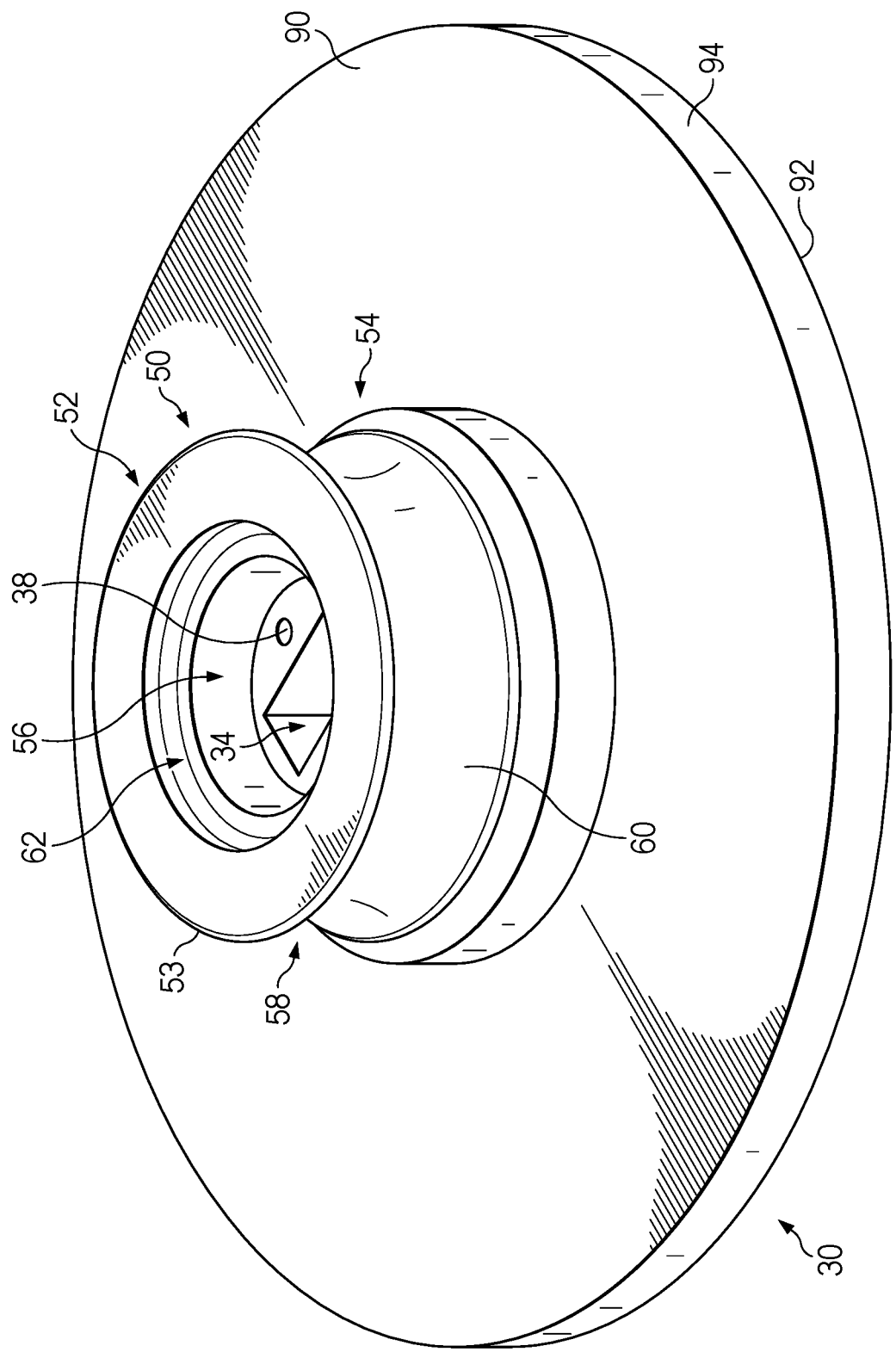
FIG. 1 is a perspective view depicting a mounting base of a transducer assembly in accordance with one embodiment.

Transducer assemblies are described in connection with the views and examples of FIGS. 1-15, wherein like numbers indicate the same or corresponding elements throughout the views. A load cell or transducer assembly 20 in accordance with a first embodiment is described herein with reference to FIGS. 1-8. The transducer assembly 20 is shown in FIG. 7 to include, for example, a mounting base 30, a collar 50, a magnet 70, and a Hall effect sensor 74. In one embodiment, the magnet 70 comprises a permanent magnet, though in other embodiments a magnet can be an electromagnet or otherwise.

Figure 2:
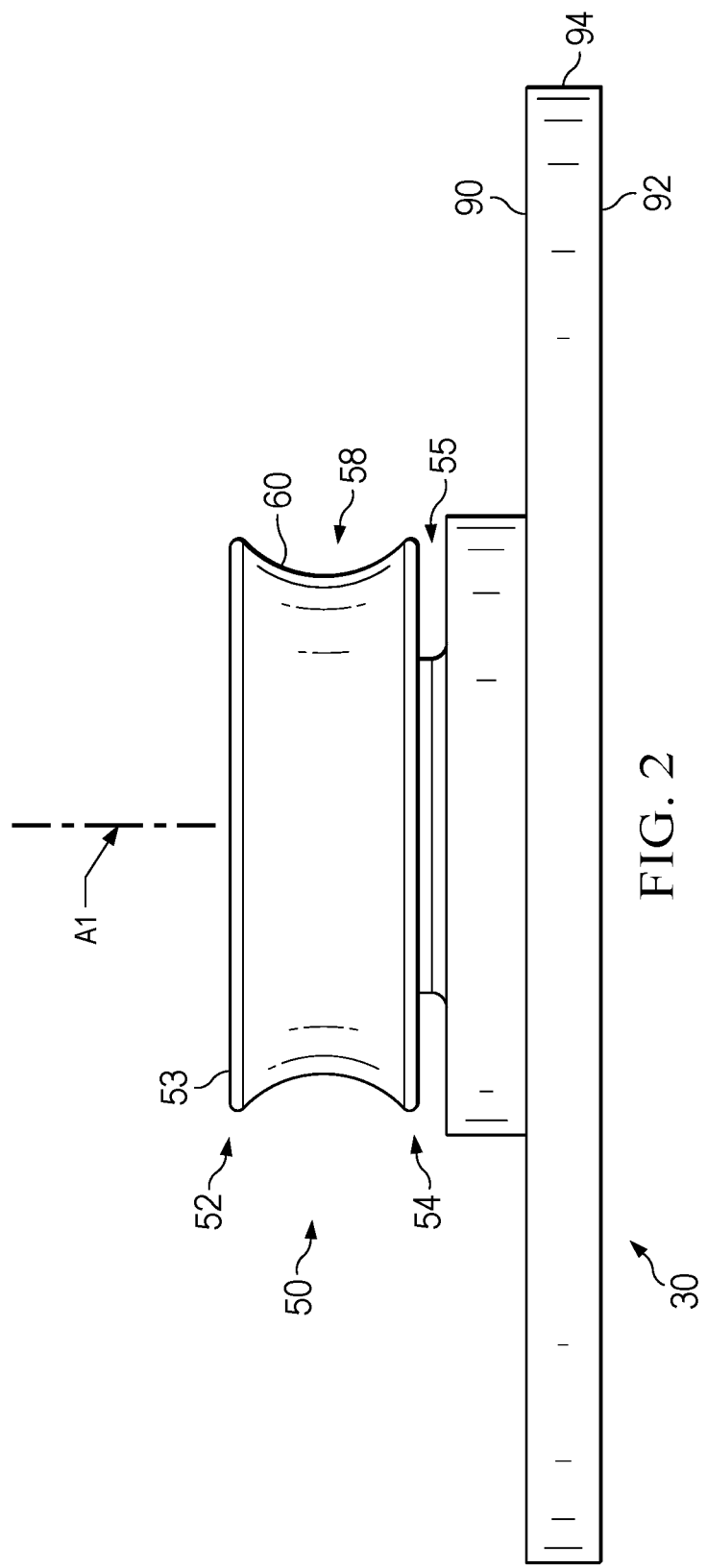
FIG. 2 is a side elevational view depicting the mounting base of FIG. 1.
Figure 3:
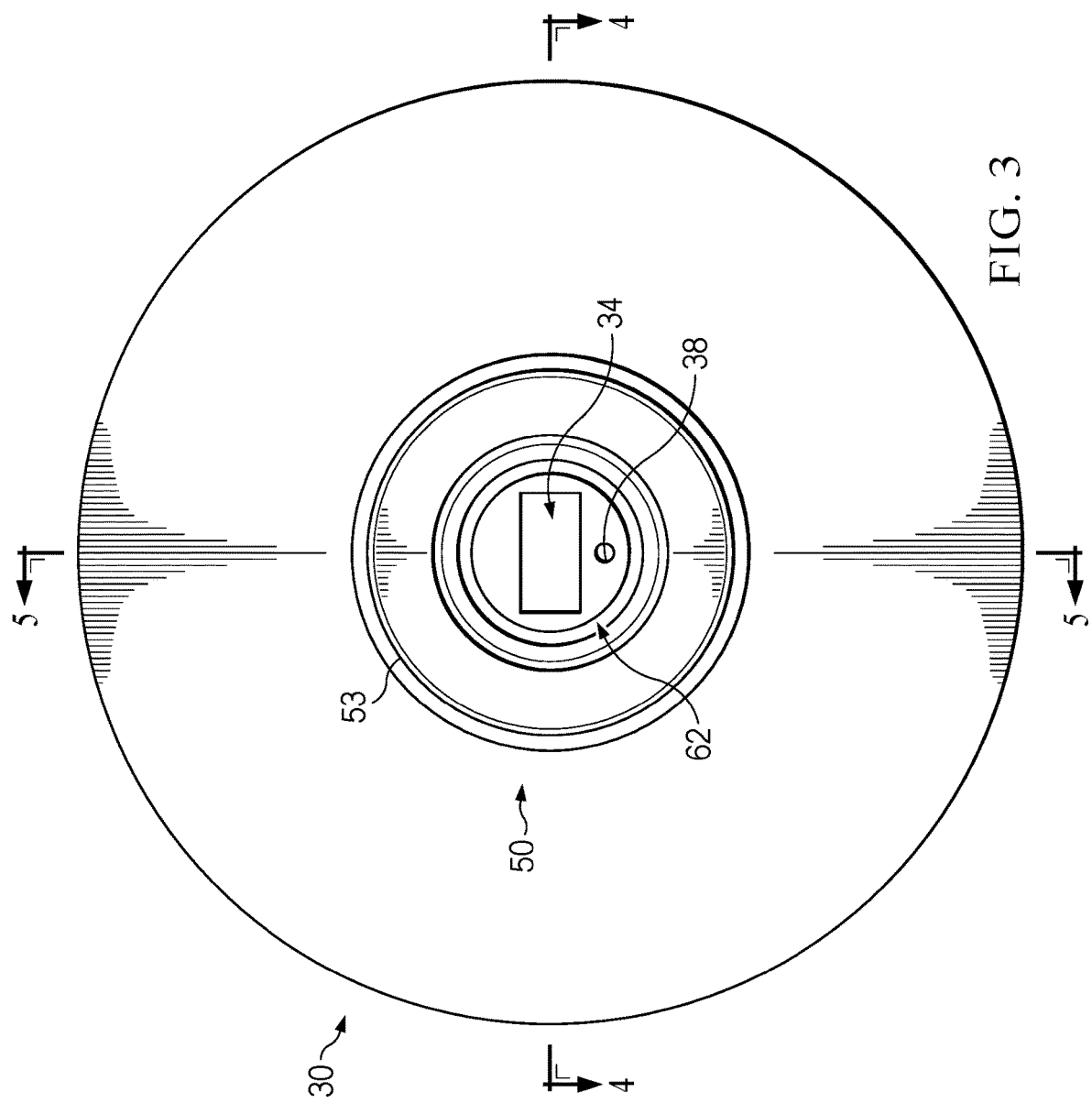
FIG. 3 is a top plan view depicting the mounting base of FIG. 1.
Figure 4:
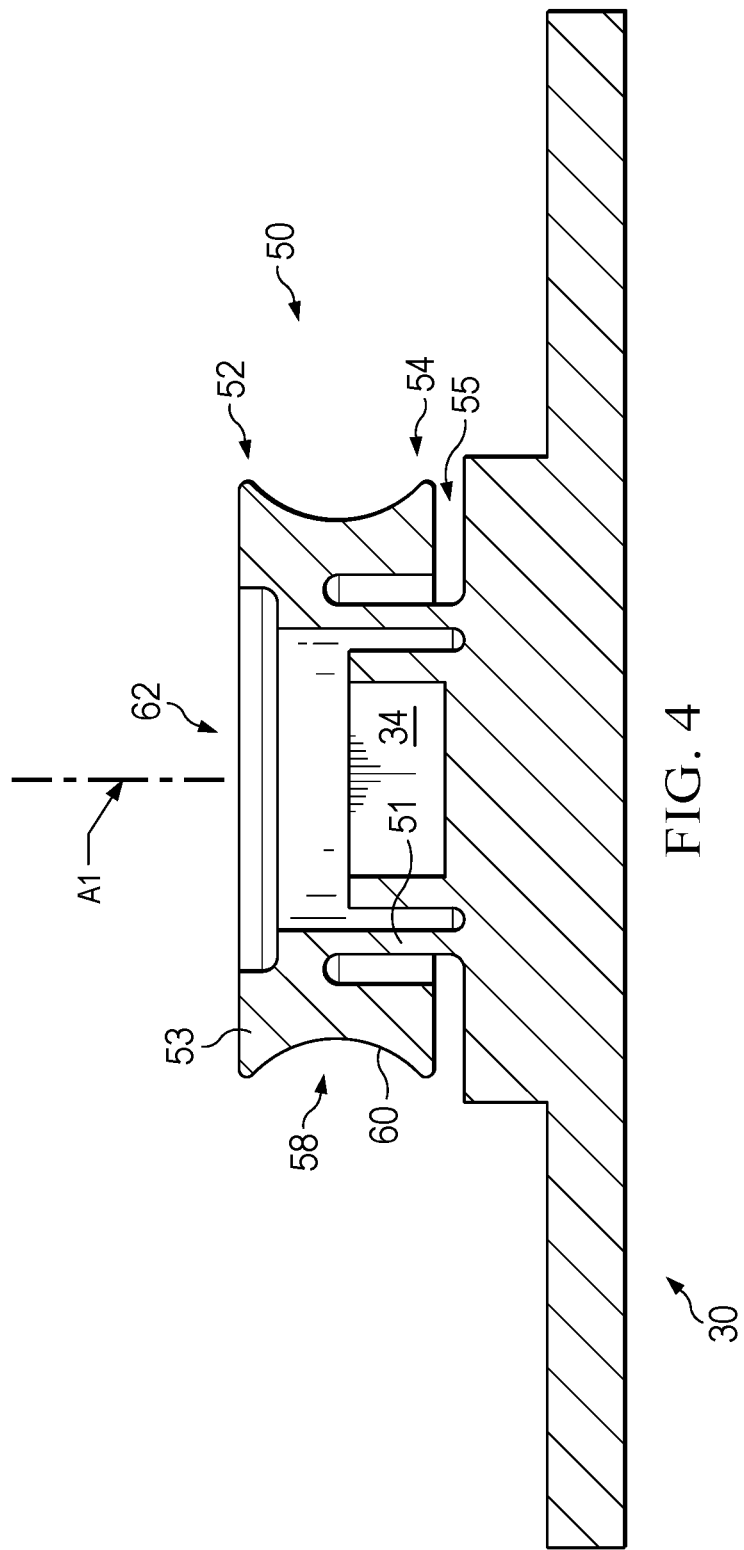
FIG. 4 is a cross-sectional view taken along the line 4-4 in FIG. 3.
Figure 5:
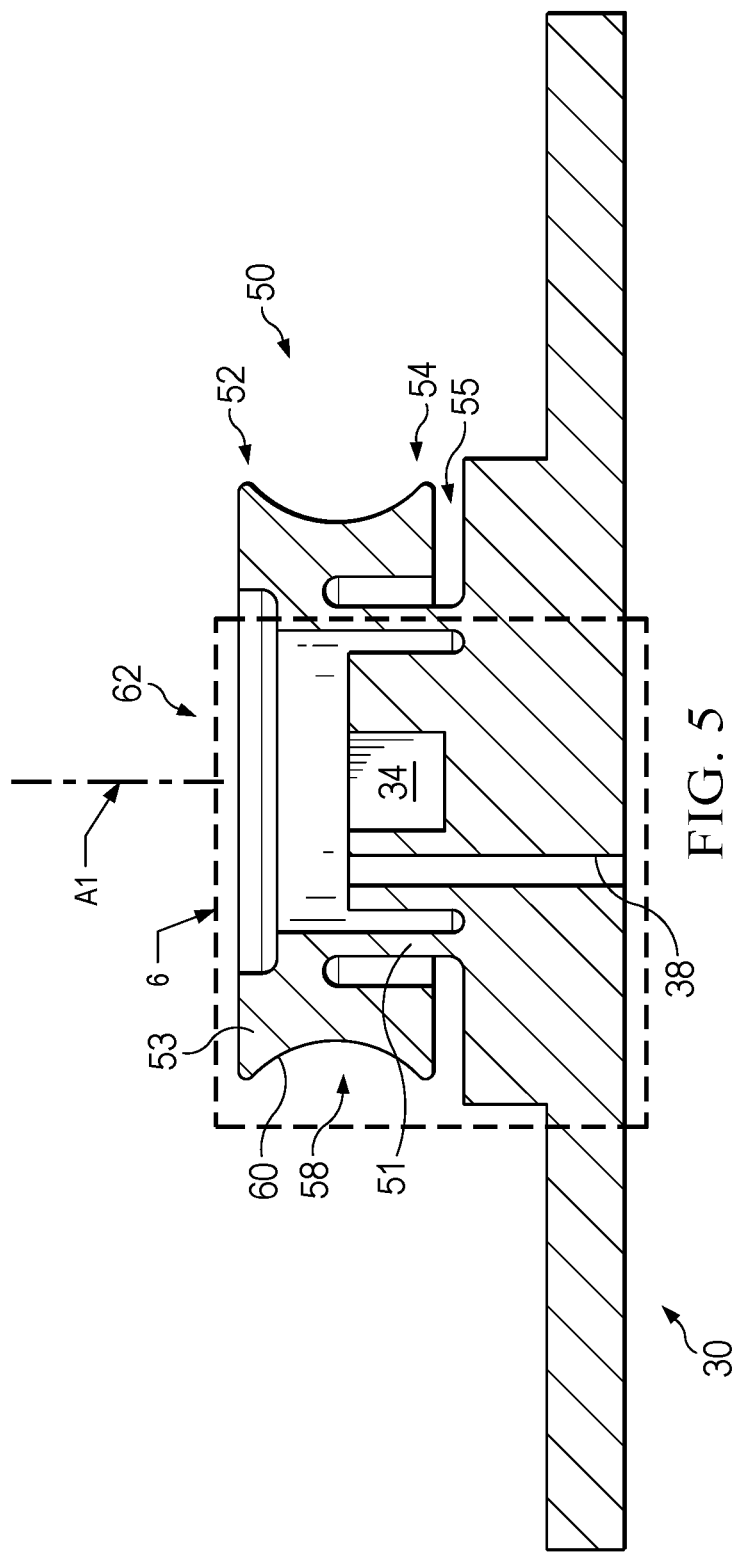
FIG. 5 is a cross-sectional view taken along the line 5-5 in FIG. 3.

The mounting base 30 is shown in FIGS. 1-2 to include an upper surface 90, a lower surface 92 and a side surface 94. With reference to FIG. 2, it will be appreciated that each of the upper surface 90 and the lower surface 92 can reside within respective planes that bisect an axis A1 and are spaced from and parallel with one another. The side surface 94 is shown to extend between and generally perpendicularly to each of the upper surface 90 and the lower surface 92. With further reference to FIG. 1, the side surface 94 is shown to extend circumferentially about the axis A1 and to have a width extending generally parallel with the axis A1. It will be appreciated that, in this configuration, one or more of the upper surface 90, the lower surface 92 and the side surface 94 can facilitate effective securement of the mounting base 30 to another structure, as will be appreciated with further reference to the below.

Figure 9:
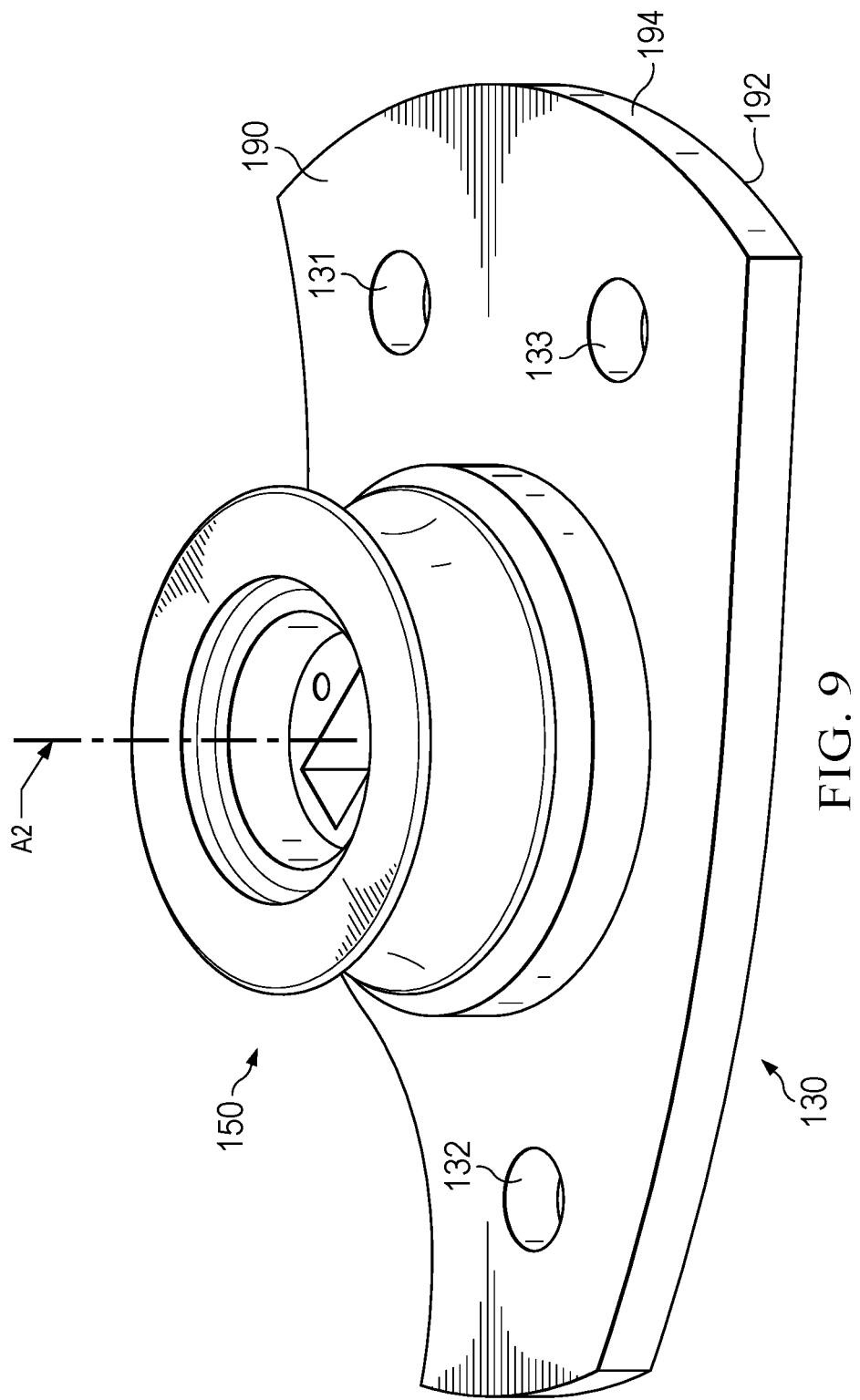
FIG. 9 is a perspective view depicting a mounting base of a transducer assembly in accordance with another embodiment.

It will also be appreciated that, while the mounting base 30 is shown to generally have the shape of a round disc, a mounting base can alternatively be provided in any of a variety of other suitable configurations. For example, in FIG. 9, a mounting base 130 is shown to include an upper surface 190, a lower surface 192 and a side surface 194. In this configuration, and similar with respect to the mounting base 30 of FIG. 1, each of the upper surface 190 and the lower surface 192 of the mounting base 130 are shown to reside within respective planes that bisect an axis A2 and are spaced from and parallel with one another. Also, similar with respect to the mounting base 30 of FIG. 1, the side surface 194 of the mounting base 130 is shown to have a width extending generally parallel with the axis A2 and between and generally perpendicularly to each of the upper surface 190 and the lower surface 192. However, unlike the side surface 94 of the mounting base 30 of FIG. 1, the side surface 194 of the mounting base 130 is shown to extend about the axis A2 to define a non-circumferential shape. While the example of FIG. 9 illustrates the side surface 194 of the mounting base 130 to extend about the axis A2 to define an irregular shape, it will be appreciated that in other embodiments, a side surface of a mounting structure can alternatively extend about such an axis of the mounting structure to define a rectangular share, an ovular shape, a star shape, or any of a variety of other suitable shapes as will be suitable to facilitate effective securement of the mounting base to another structure.

Figure 10:
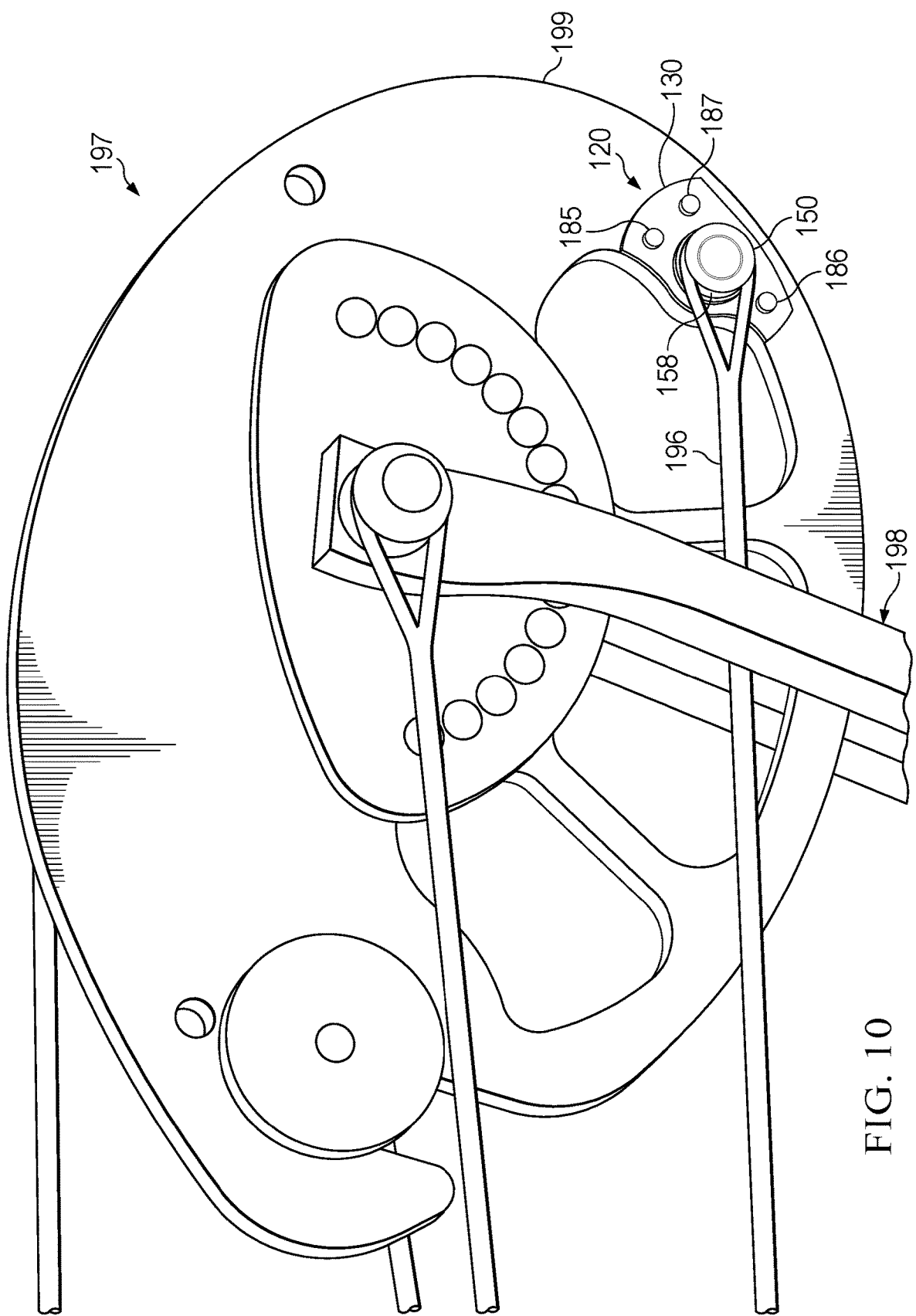
FIG. 10 is a perspective view depicting a transducer assembly, including the mounting base of FIG. 9, provided as part of a cam assembly of an archery bow, in accordance with one embodiment.

The mounting base 130 is shown in FIG. 10 to be provided as part of a transducer assembly 120 of a cam assembly 197 associated with a bow limb assembly 198 of an archery bow. In particular, it can be seen that the specific irregular shape of the side surface 194 of the mounting base 130 can be suitable for correspondence and attachment to a cam 199 of the cam assembly 197, so as not to adversely interfere with desired operation or movement of the cam 199. In this configuration, it will be appreciated that the lower surface 192 of the mounting base 130 can contact the cam 199, and bolts 185, 186 and 187 or other suitable fasteners can be provided into respective corresponding apertures in the mounting base 130 (e.g., mounting apertures 131, 132 and 133 in FIG. 9) and the cam 199 to facilitate securement of the mounting base 130 to the cam 199. In other embodiments, fewer than three or more than three fasteners can be used to facilitate securement of a mounting base to another structure such as a cam. In still other embodiments, a mounting base can be effectively secured to another structure without use of fasteners such as bolts, rivets, studs, or the like, and instead can involve use of welds, adhesives, interlocking mechanical features, or through integral unitary formation therewith, for example.

While in the above examples, each of the upper surfaces 90, 190 and the lower surfaces 92, 192 of the mounting bases 30, 130 are shown to reside within respective planes that bisect the respective axis A1, A2 and are parallel with one another, it will be appreciated that in other embodiments, upper and lower surfaces of a mounting base can reside within respective planes that bisect such an axis but are not parallel with one another, such that they are converging or diverging from one another. Also in the above examples, while the side surfaces 94, 194 of the mounting bases 30, 130 are shown to extend generally parallel with the respective axis A1, A2 and between and generally perpendicularly to each of the upper surface 90, 190 and the lower surface 92, 192, it will be appreciated that in other embodiments, a side surface of a mounting base might not extend generally parallel with such an axis and/or might not be generally perpendicularly to one or both of an upper surface and a lower surface of a mounting base.

Referring again to FIGS. 1-6, it will be appreciated that the collar 50 can extend from the mounting base 30. The collar 50 can extend from a proximal end 54 to a distal end 52. The proximal end 54 of the collar 50 is shown to be fixedly coupled with the mounting base 30, such that the collar 50 extends along the axis A1 from adjacent to the upper surface 90 of the mounting base 30. The distal end 52 of the collar 50 is shown to be spaced from the mounting base 30, such that the distal end 52 is capable of lateral movement relative to the axis A1 as will be appreciated with reference to the discussion below. In one embodiment, as illustrated in FIGS. 1-6, the collar 50 and the mounting base 30 can be integrally formed as a unitary structure such as from steel, aluminum, titanium, another metal, an alloy thereof, or from another material such as plastic, carbon fiber, wood, fiberglass, or another material or combination thereof. In other embodiments, a collar can be formed separately from a mounting base and attached to the mounting base such as with welding, adhesive, and/or interlocking mechanical features.

With further reference to FIGS. 1-6, the collar 50 can define a bore 56 and can extend along the axis A1 from adjacent to the proximal end 54 to adjacent to the distal end 52. The distal end 52 of the collar 50 can define an opening 62 extending into and in communication with the bore 56. The bore 56 can be defined within an interior of the collar 50, and at least in part by a wall 51 (FIG. 4) of the collar 50.

It will be appreciated that a suitable interface structure can be provided on an exterior of the collar 50. For example, such an interface structure can facilitate attachment of a flexible cord or other force transmission member to the transducer assembly 20. More particularly, with reference to the example of FIGS. 1-6, the collar 50 is shown to comprise a hat 53 having an exterior groove 58 with a concave bearing surface 60. In this configuration, it will be appreciated that a flexible cord can be least partially disposed within the exterior groove 58 and in contact with the concave bearing surface 60, such that force imparted upon the flexible cord can be received by the collar 50 and transmitted from the collar 50 to the mounting base 30. In one embodiment, it will be appreciated that the interface structure can be provided in the form of a sheave or other suitable structure having an exterior groove suitable for receiving a flexible cord. For example, referring to FIG. 10, it can be seen that a flexible cord 196 is partially received within an exterior groove 158 of a collar 150 of the transducer assembly 120, to facilitate attachment of the flexible cord 196 to the cam 199 of the cam assembly 197 of the archery bow. The flexible cord 196 is thus shown to be routed in contact with and at least partially around a circumference of the collar 150 of the transducer assembly 120, whereby a load upon the flexible cord 196 can be received and measured by the transducer assembly 120. In other embodiments, it will be appreciated that a transducer assembly might not be configured to receive a flexible cord, but might instead be configured for attachment to another type of flexible force transmission apparatus (e.g., a chain) or to a rigid structure such as an arm, a plate, a buttress or otherwise.

Figure 6:
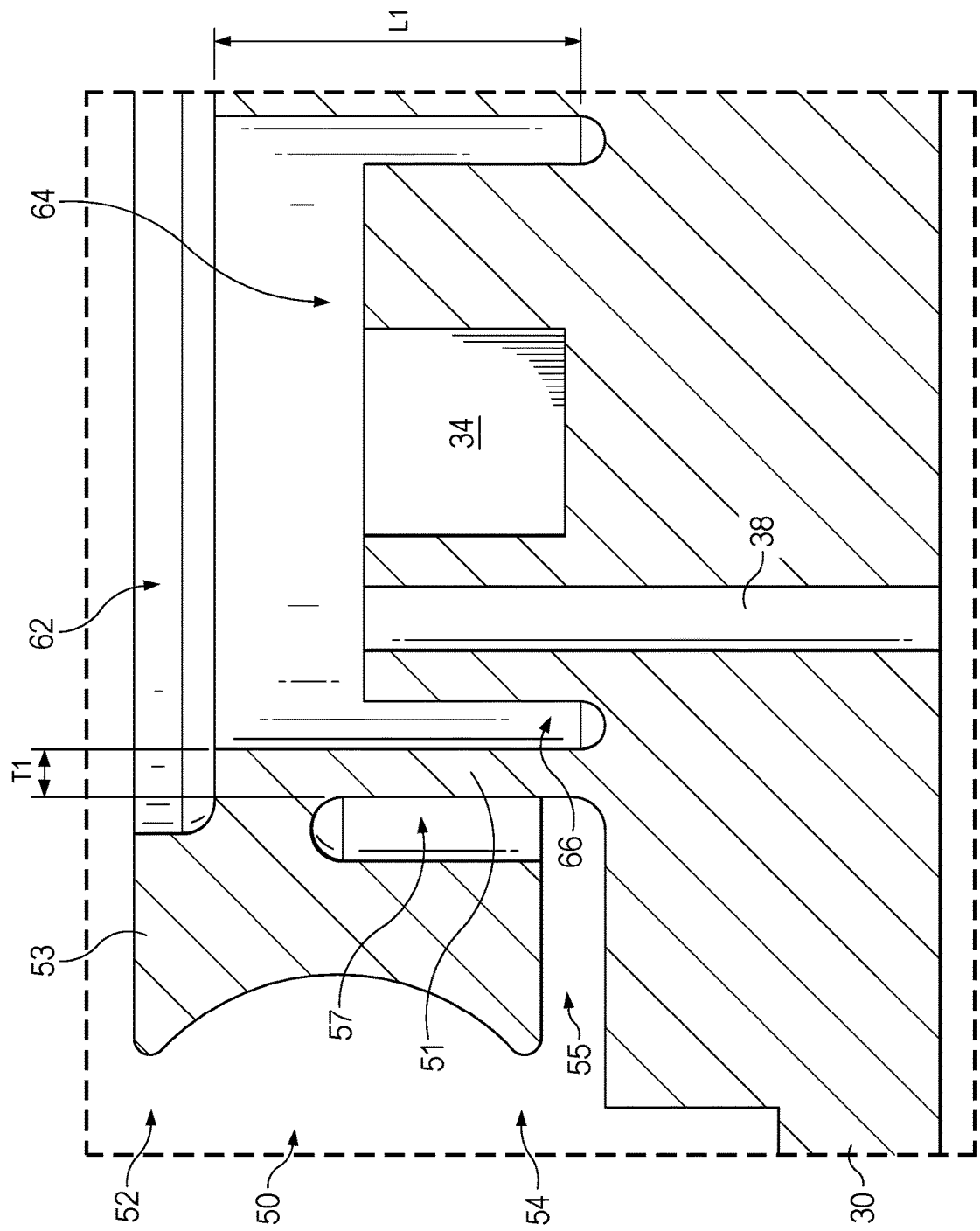
FIG. 6 is an enlargement of a portion of FIG. 5.
Figure 7:
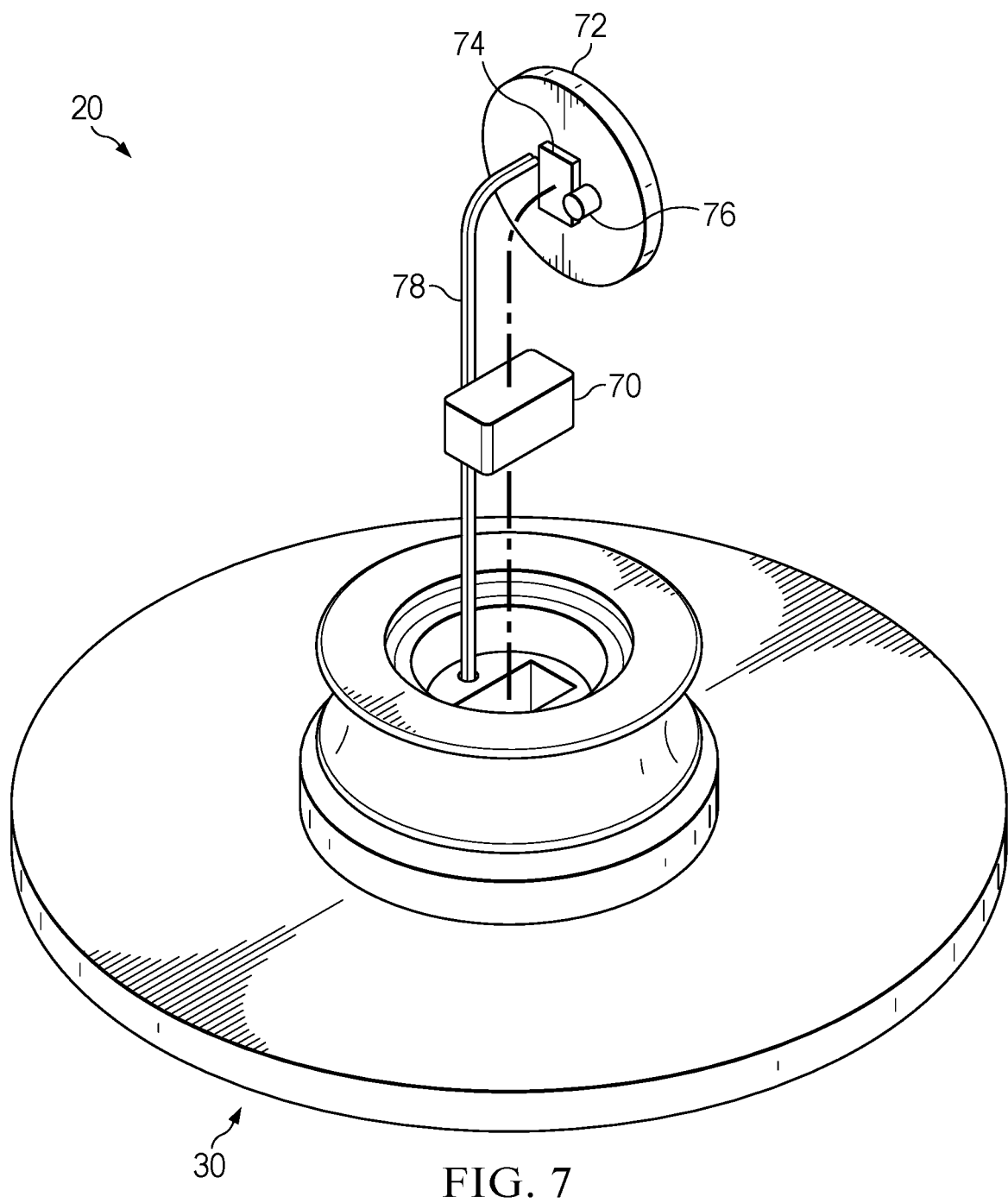
FIG. 7 is a partially exploded perspective view depicting a transducer assembly including the mounting base of FIG. 1 in combination with other components, in accordance with one embodiment.

In the example of FIGS. 1-6, the wall 51 of the collar 50 is shown to be fixedly coupled at a first end with the mounting base 30 adjacent to the proximal end 54 of the collar 50, and to extend a length (L1 in FIG. 6) along the axis A1 toward a second end, from which the hat 53 extends adjacent to the distal end 52 of the collar 50. As shown in FIG. 6, in one embodiment, the wall 51 can have a generally uniform thickness (T1 in FIG. 6) along its entire length (L1 in FIG. 6). However, in other embodiments, it will be appreciated that a wall of a collar can have a non-uniform thickness along its length.

Referring still to FIG. 6, in one embodiment, the hat 53 can extend laterally outwardly from the wall 51 adjacent to the distal end 52 of the collar 50, and thenceforth can include a portion extending back toward the mounting base 30. It will be appreciated with reference to FIG. 6 that this portion of the hat 53 extending back toward the mounting base 30 can comprise the exterior groove 58 and the concave bearing surface 60, can be spaced longitudinally from contacting the mounting base 30 by an annular gap 55, and can be spaced laterally from the wall 51 by an annular gap 57. In this configuration, it will be appreciated that forces applied to the hat 53 resulting from contact by a flexible cord with the concave bearing surface 60, can result in bending of the wall 51 and resultant lateral displacement of the hat 53 relative to the axis A1. It will be further appreciated that the annular gap 55 can prevent contact and dragging of the hat 53 relative to the mounting base 30 during bending of the wall 51.

It will further be appreciated that the amount of bending of the wall 51 resulting from application of such forces can be determined based upon factors such as the thickness T1 of the wall 51, the length L1 of the wall 51, and the material forming the wall 51. Engineering design of the wall 51 can be accomplished for specific applications of the transducer assembly 20, to ensure that the wall 51 is strong enough to survive without permanent deformation under any loading it will receive in normal use, yet flexible enough to allow adequate compliance to facilitate measurable deflection to accomplish measurement of loading. If the wall 51 is too weak for a particular application, the wall 51 can permanently bend in use, resulting in subsequent inoperability of the transducer assembly 20. However, if the wall 51 is too strong, the wall 51 may not adequately bend under loading to facilitate measurement thereof. The wall 51 can therefore optimally be over-designed by a specific amount in order allow some bending yet withstand permanent deformation in response to a particular loading, e.g., by a factor of about 1 to about 5, by a factor of about 2 to about 4, by a factor of about 2.5, or by another factor. For example, the wall 51 can be designed to reliably sustain a load of about 150 pounds transmitted to the collar 50 through a flexible cord attached to the collar 50, even though in use the load will not exceed about 60 pounds, thereby resulting in a factor of 2.5. In this example, the wall 51 can experience deflections large enough to facilitate measurements through use of the Hall effect as described herein, but stresses that are low enough so that it will survive without deformation in use.

Assuming that the configuration and material of the wall 51 are suitably selected for a particular application, it will be appreciated that such bending of the wall 51 can be temporary in response to application of the force, and that the wall 51 will resume its typical non-bent configuration (as shown in FIGS. 1-6) upon removal of the force. In one embodiment, it will be appreciated that the amount of bending of the wall 51 can be in linear or non-linear proportion to the amount of force applied to the hat 53 depending upon, for example, the configuration and material of the wall 51. Therefore, by measuring lateral deflection of the distal end 52 of the collar 50 (e.g., relative to the axis A1), an amount of force applied to the collar 50 by a flexible cord can be determined. As will be appreciated with reference to the following, there are several suitable configurations and methods to accomplish measurement of the lateral defection of the distal end 52 of the collar 50 (e.g., relative to the axis A1), and thus determining an amount of force applied to the collar 50, certain of which are described herein and others which will be appreciated with reference hereto.

For example, in a first embodiment, to accomplish such measurement and determination, a magnet can be fixedly coupled with a mounting base and a Hall effect sensor can be fixedly coupled to a distal end of a collar of a transducer assembly. More particularly, as shown in the example of FIGS. 1-6, a pedestal 64 (FIG. 6) can be disposed within the bore 56 and fixedly coupled to the mounting base 30. The pedestal 64 can define a receptacle 34 configured to receive a magnet 70 (FIG. 7). In one embodiment, adhesive can be provided to facilitate fixed coupling of the magnet 70 to the pedestal 64 and within the receptacle 34. In such a configuration, an annular gap 66 (FIG. 6) can be provided extending laterally between the pedestal 64 and the collar 50, as well as longitudinally from the proximal end 54 toward the distal end 52. It can be seen that, in this configuration, the collar 50 and the pedestal 64 can be concentrically disposed while extending longitudinally from the proximal end 54 toward the distal end 52. While the mounting base 30, the pedestal 64, and the collar 50 are shown to be integrally formed as a unitary structure, it will be appreciated that in other embodiments, one or more of these structures can be formed separately for attachment to the other(s). While the pedestal 64 is described to facilitate fixed coupling of the magnet 70 to the mounting base 30, it will be appreciated that in other embodiments, no pedestal may be provided and a magnet can be disposed within a receptacle provided in a mounting base or otherwise attached to a mounting base (e.g., without a receptacle). While not required, provision of the receptacle 34 can facilitate convenient provisioning of the magnet 70 in a desired orientation relative to the mounting base 30, such that the associated transducer assembly 20 can be reliably and conveniently oriented in use to accept a force from a predetermined direction (e.g., from a flexible cord).

In this first embodiment where the magnet 70 is fixedly coupled to the mounting base 30 (e.g., through use of the pedestal 64), the Hall effect sensor 74 can be secured and fixedly coupled to the distal end 52 of the collar 50. As will be appreciated with reference to FIGS. 7-8, when the transducer assembly 20 is assembled, the Hall effect sensor 74 can be at least partially disposed or fully disposed within the bore 56, and then secured relative to the distal end 52 of the collar 50 such as with adhesive. One or more wires 78 electrically coupled with the Hall effect sensor 74 can be routed to pass within the bore 56 and through an aperture 38 defined through the pedestal 64 and the mounting base 30, to a location exterior the transducer assembly 20.

Figure 8:
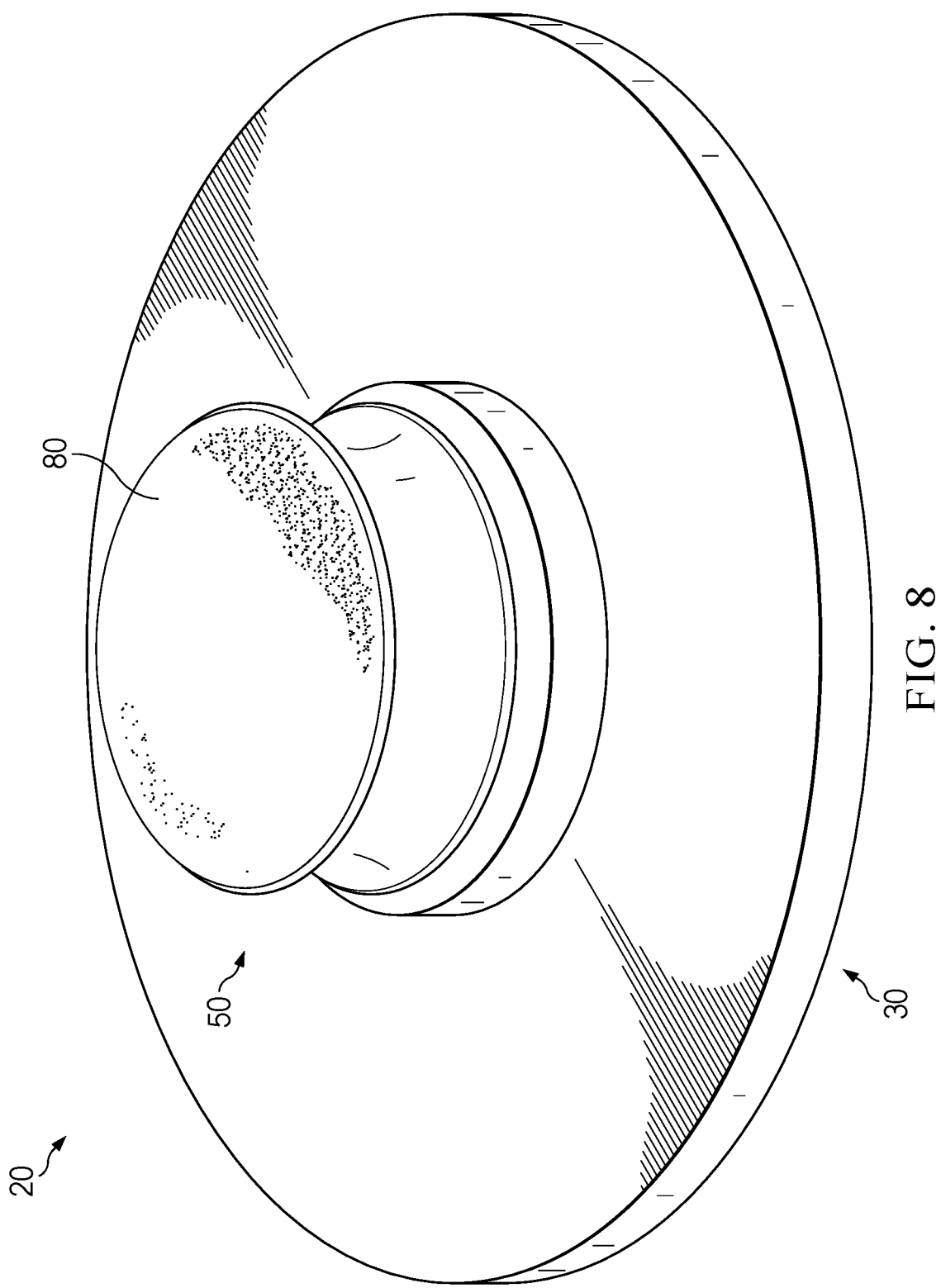
FIG. 8 is a perspective view depicting the transducer assembly of FIG. 7 when fully assembled.

More particularly, and in the example of FIGS. 7-8, it can be seen that the Hall effect sensor 74 can be mounted to a circuit board 72, the circuit board 72 can be at least partially disposed or fully disposed within the bore 56, and then secured relative to the distal end 52 of the collar 50 such as with adhesive 80 which additionally can facilitate sealing of the opening 62 (e.g., to prevent entry of moisture or debris into the bore 56). As shown in FIG. 8, the adhesive 8 can comprise an epoxy resin or potting compound which can be configured to seal and provide protection to distal end 52 of the collar 50, Hall effect sensor 74, and/or other components of the transducer assembly 20. In addition to the Hall effect sensor 74, the circuit board 72 can support a capacitor 76 which can be electrically coupled with the Hall effect sensor 74. The wires 78 can also be electrically coupled with the circuit board 72. In this configuration and when fully assembled as shown in FIG. 8, it will be appreciated that the Hall effect sensor 74 and capacitor 76 can fully reside within the bore 56 and thus be prevented from being contacted or damaged by components external of the transducer assembly 20. When assembled in this manner, it will be appreciated that the Hall effect sensor 74 can be spaced longitudinally from the magnet 70, and can thus be configured to detect lateral deflection of the distal end 52 of the collar 50 (e.g., relative to the axis A1). It will be appreciated that, by coupling the magnet 70 to the mounting base 30 and thus within the bore 56, the magnet 70 can be given some physical protective shielding by the remaining components of the transducer assembly 20.

While the embodiment of FIGS. 7-8 illustrates the Hall effect sensor 74 and capacitor 76 being attached to the circuit board 72, it will be appreciated that, in other embodiments, a transducer assembly can instead include a custom packaged Hall effect sensor assembly which includes an internal capacitor, and from which wires (e.g., similar to 78) can directly extend. The custom packaged Hall effect sensor assembly can have a size, form factor and shape that beneficially corresponds with the desired characteristics of the transducer assembly and can, for example, have some similarity to that of a standard package such as SOT23, TO-92, TO252, TO220, or otherwise. It will be appreciated that a custom packaged Hall effect sensor can individually be very expensive when ordered in small quantities (e.g., less than 100,000 units). But when budgets and/or quantities can justify, use of a custom packaged Hall effect sensor within a transducer assembly might generally be deemed a more elegant solution. However, in relatively low quantities, use of a conventional off-the-shelf Hall effect sensor can just as effectively be used, such as by mounting it to a custom-designed circuit board (e.g., as shown in FIG. 7).

In one embodiment, wires 78 can include three distinct wires, namely a power wire, a ground wire and a signal wire. Power can be provided to the Hall effect sensor 74 through use of the power wire and the ground wire. In use, the Hall effect sensor 74 can produce an electrical signal indicative of the amount of lateral deflection of the distal end 52 of the collar 50, which can be transmitted by and received from the Hall effect sensor 74 by way of the signal wire such as in the form of a 0-5 V, 4-20 mA, PWM, or binary data signal corresponding to its measured position of the magnet 70. In an alternative embodiment, it will be appreciated that fewer than three or more than three wires can lead to a Hall effect sensor of a transducer assembly. For example, in one alternative embodiment, only a single wire can lead to a Hall effect sensor, thereby providing power thereto, in which case ground can be received by the Hall effect sensor through a conductive mounting base and/or collar, and a signal can then be selectively superimposed by the Hall effect sensor upon the single wire or transmitted wirelessly from the Hall effect sensor assembly. In yet another alternative embodiment, a Hall effect sensor assembly can be configured not to receive any wires, and instead can comprise power harvesting circuit and/or data communications circuits (e.g., near field communications) within its package. Based upon an electrical signal received through the wires (e.g., 78) or wirelessly from the Hall effect sensor 74, an amount of loading or force applied to the transducer assembly 20, e.g., by a flexible cord, can be identified.

Figure 11:
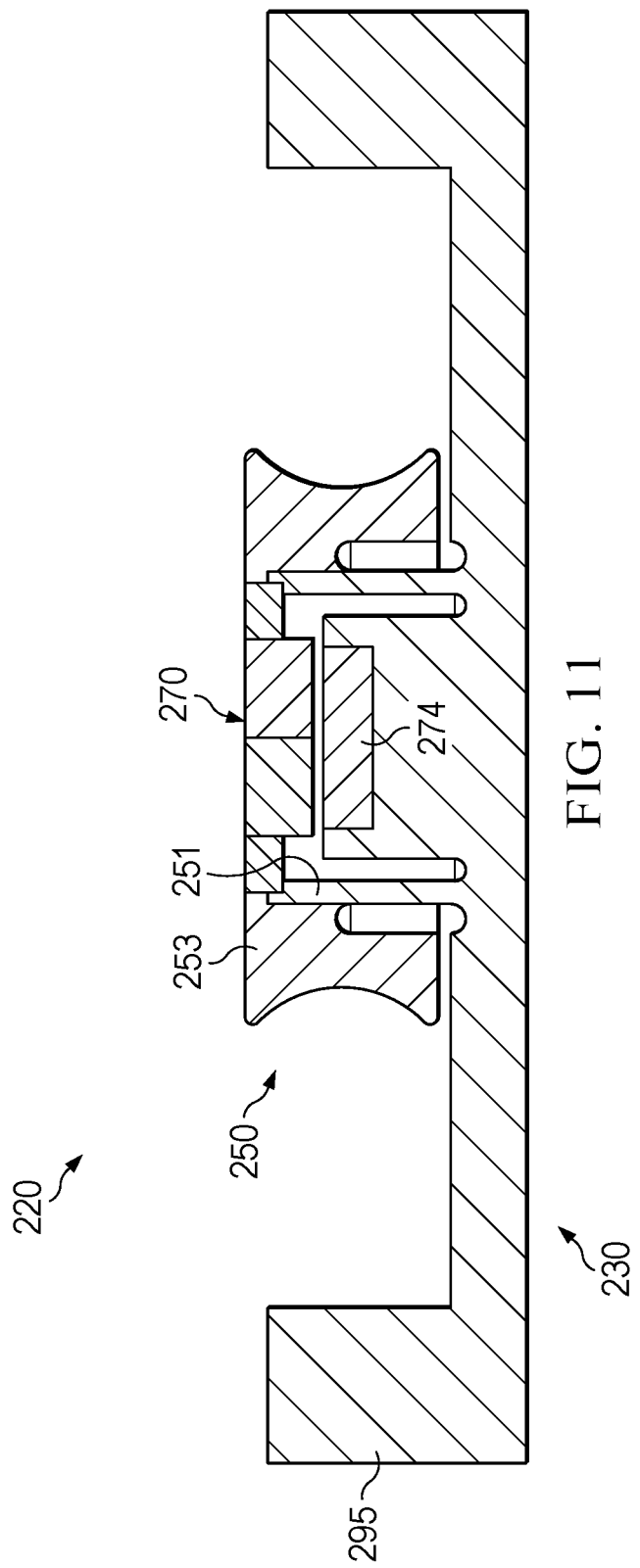
FIG. 11 is a cross-sectional schematic view depicting a transducer assembly, in accordance with another embodiment.

In a second embodiment, to accomplish such measurement and determination, a Hall effect sensor can be fixedly coupled with a mounting base and a magnet can be fixedly coupled relative to a distal end of a collar of a transducer assembly. More particularly, as shown schematically in the example of FIG. 11, a transducer assembly 220 can include a Hall effect sensor 274 disposed within a bore defined by a collar 250, wherein the Hall effect sensor 274 is fixedly coupled to a mounting base 230 (either directly or by way of a circuit board). In one embodiment, adhesive can be provided to facilitate fixed coupling of the Hall effect sensor 274 within a receptacle or otherwise relative to the mounting base 230. The transducer assembly 220 can also include a magnet 270 that can be secured and fixedly coupled to a distal end of the collar 250, as generally shown in FIG. 11. As will be appreciated with reference to FIG. 11, when the transducer assembly 220 is assembled, the magnet 270 can be at least partially disposed or fully disposed within the bore, and then secured and fixedly coupled relative to the distal end of the collar 250 such as with adhesive. One or more wires (not shown) coupled with the Hall effect sensor 274 can be routed to pass from the bore and through an aperture defined through the mounting base 230, for example, to a location exterior the transducer assembly 220. It will be appreciated that each of the features and alternative embodiments described with reference to the embodiments of FIGS. 1-10 are also specifically applicable to the embodiment of FIG. 11, which differs primarily in that the relative locations of the magnet and Hall effect sensor are exchanged. Other notable differences relative to the embodiments of FIGS. 1-10 include illustration in FIG. 11 of a mounting base 230 having an upwardly extending side wall flange 295, as well as a collar comprising a wall 251 and hat 253 which are formed separately but attached together.

Figure 12:
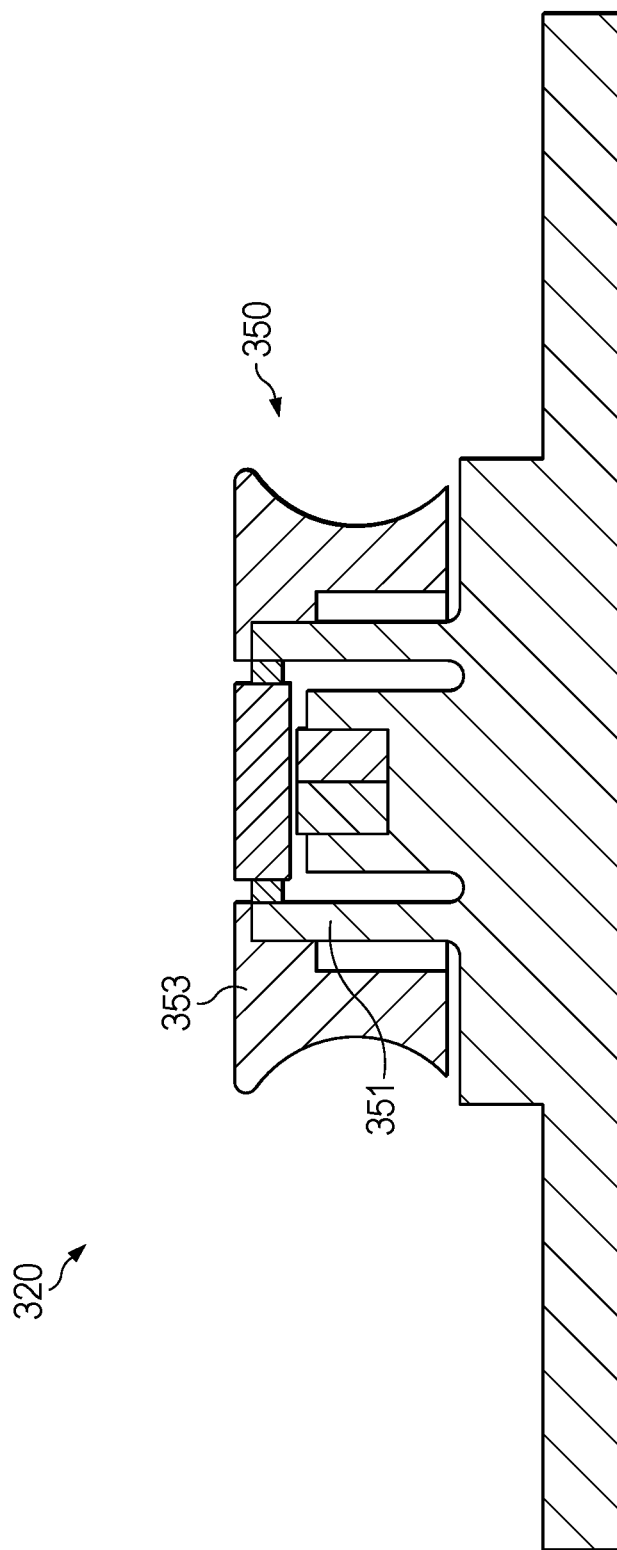
FIG. 12 is a cross-sectional schematic view depicting a transducer assembly, in accordance with yet another embodiment.

FIG. 12 schematically depicts a transducer assembly 320 which is similar to described herein relative to the embodiments of FIGS. 1-10, except for example, like the embodiment of FIG. 11, a collar 350 of the transducer assembly 320 comprises a wall 351 and hat 353 which are formed separately but attached together (e.g., with adhesive, interference fit, welding, or crimping). It will be appreciated that providing the wall 351 and the hat 353 as separate components can facilitate improved ease of manufacturing, as well as can facilitate use of optimization in selection of materials for the respective components to serve their respective functions. Each of the features and alternative embodiments described with reference to the embodiments of FIGS. 1-11 are also specifically applicable to the embodiment of FIG. 12

Figure 13:
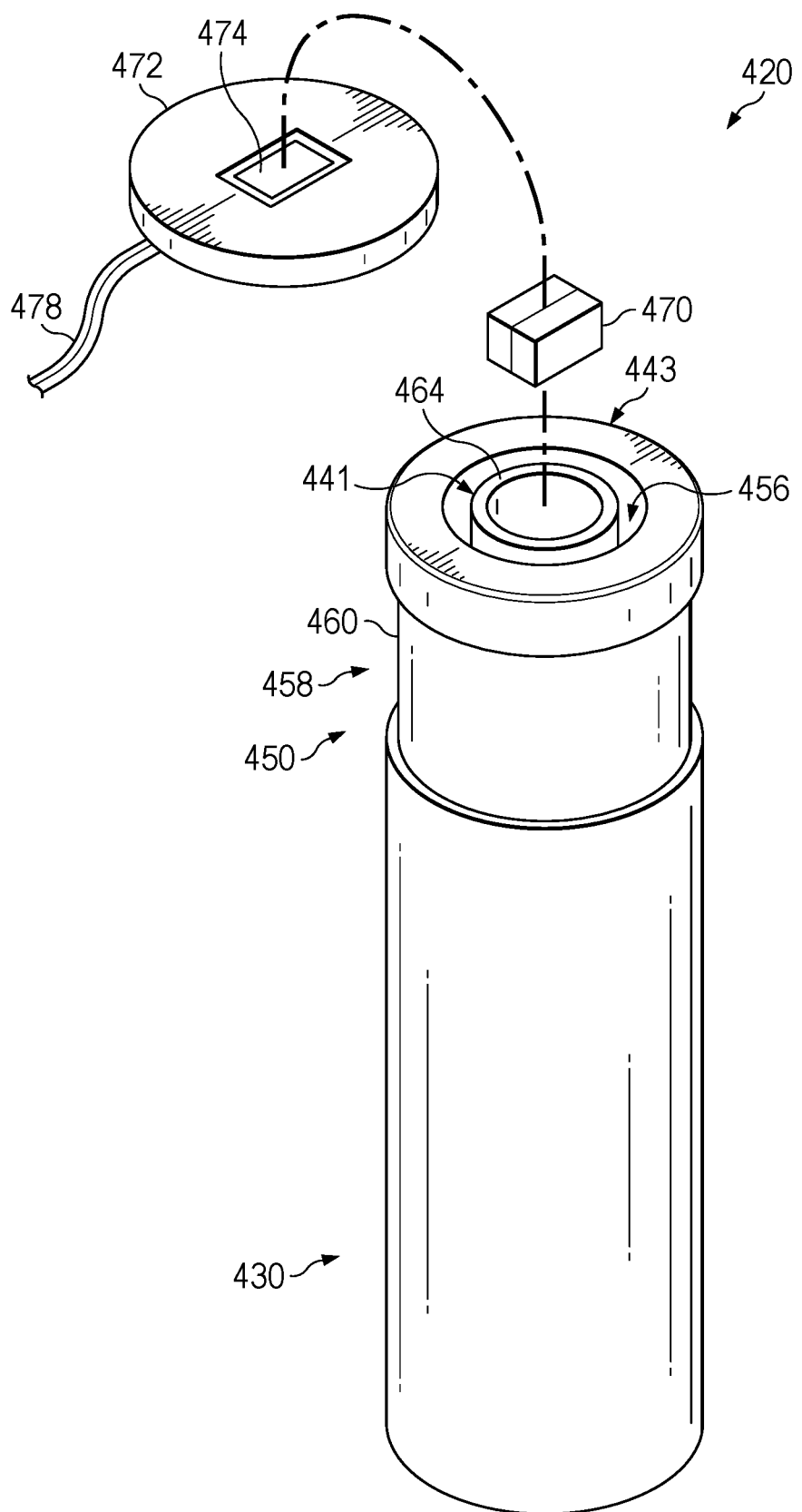
FIG. 13 is a partially exploded perspective view depicting a transducer assembly, in accordance with still another embodiment.
Figure 14:
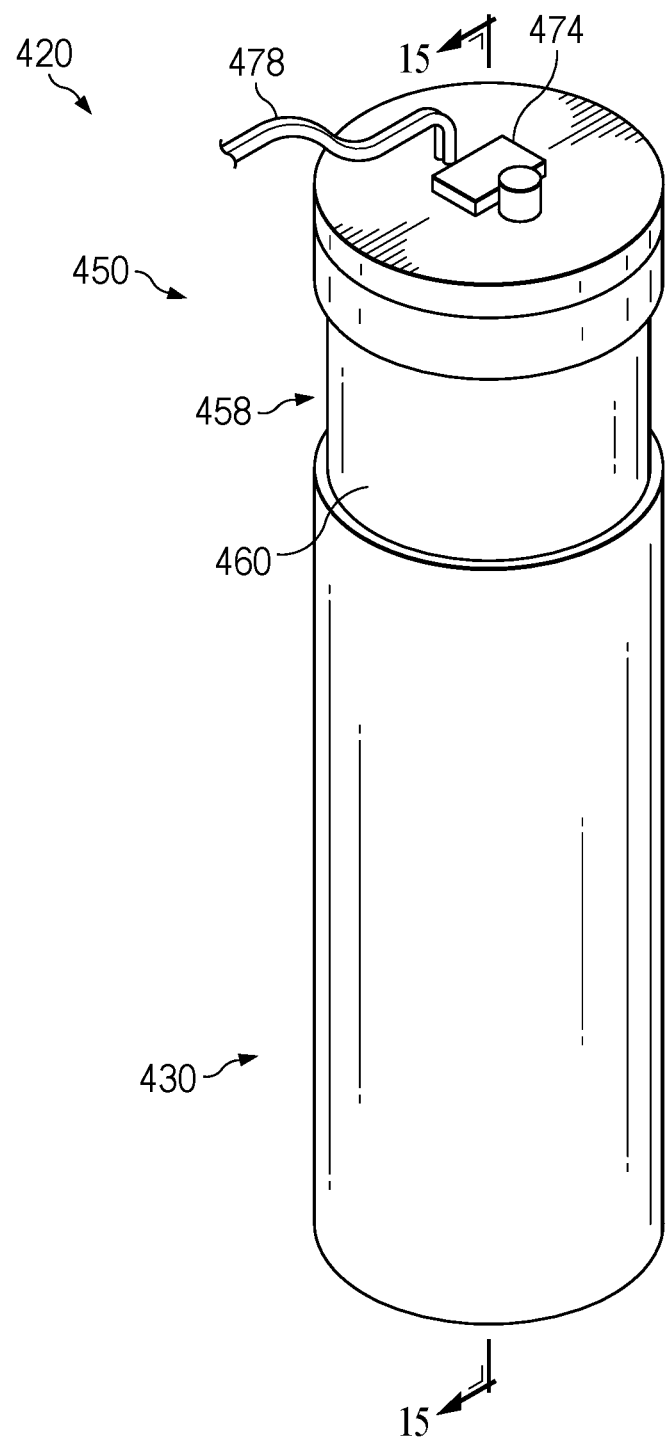
FIG. 14 is a perspective view depicting the transducer assembly of FIG. 13 when fully assembled.
Figure 15:
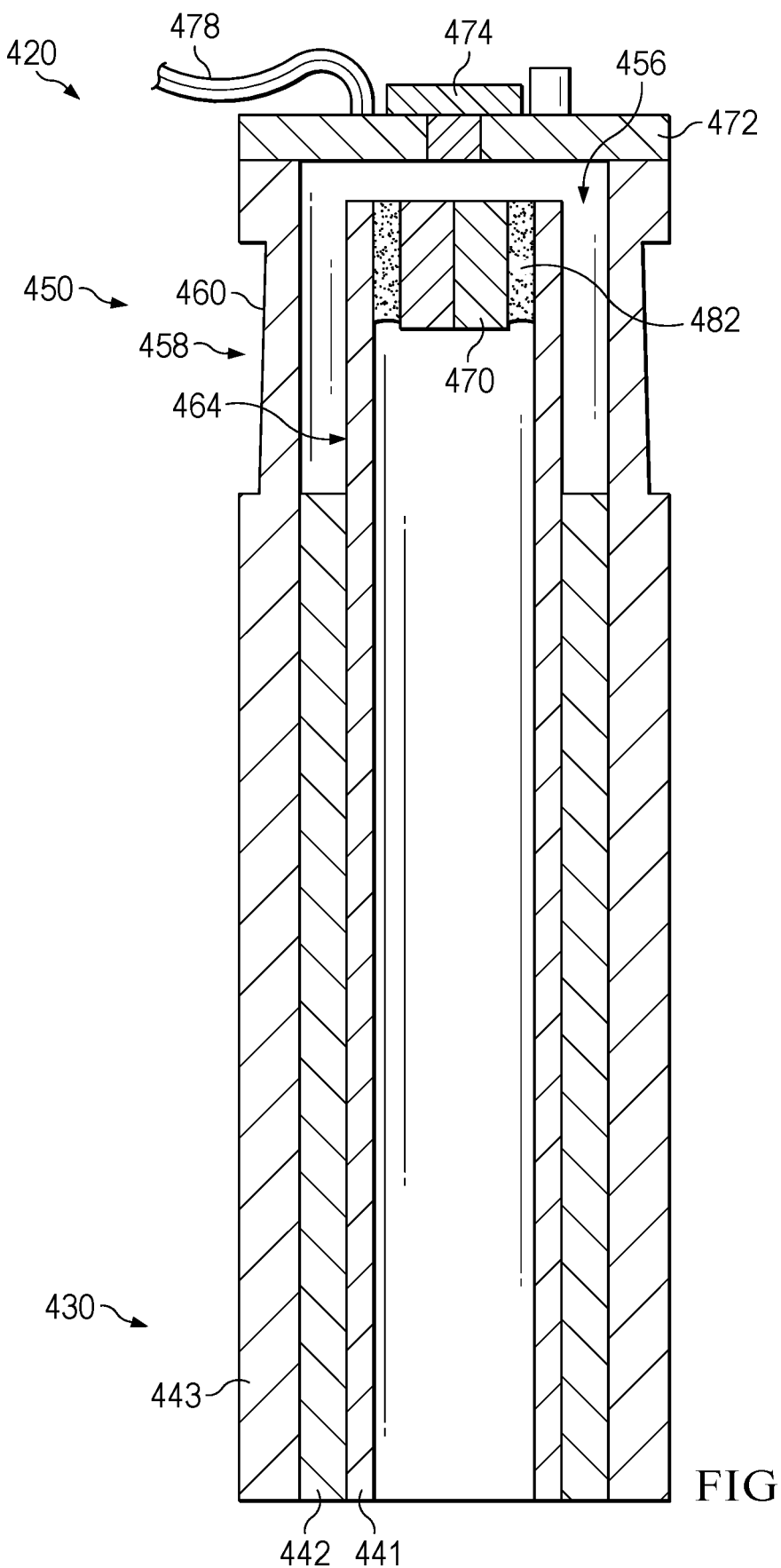
FIG. 15 is a cross-sectional view taken along the line 15-15 in FIG. 14.

FIGS. 13-15 illustrate a transducer assembly 420 which is similar to described herein relative to the embodiments of FIGS. 1-10, except primarily with respect to illustrated variations in configuration of a collar 450 and a mounting base 430, which will be appreciated with reference to FIGS. 13-15. As shown in FIG. 15, the collar 450 and the mounting base 430 can be formed through cooperation of three concentrically disposed sleeves, namely an inner sleeve 441, a middle sleeve 442 and an outer sleeve 443, which can be held together in the depicted arrangement such as through use of adhesive, interference fit, welding, crimping, or otherwise. In one embodiment, as shown in FIG. 15, each of the inner sleeve 441, the middle sleeve 442 and the outer sleeve 443 can have differing lengths, such that proximal ends of each can be aligned to provide the mounting base 430, and such that distal ends of each can have a staggered configuration. In this staggered configuration, as shown in FIG. 15, the distal end of the inner sleeve 441 can extend a distance longer than the distal end of the middle sleeve 442, but shorter than the distal end of the outer sleeve 443.

It can be seen that, in this arrangement, the inner sleeve 441 can be configured to provide a pedestal 464, within the distal end of which a magnet 470 can be secured, such as with adhesive 482, in a longitudinally spaced relation relative to a Hall effect sensor 474 supported by a circuit board 472 attached to the distal end of the outer sleeve 443. The outer sleeve 443 can define a bore 456 for receiving, e.g., in an annularly spaced circumferential relation, the pedestal 464 defined by the distal end of the inner sleeve 441. As can be appreciated with reference to FIG. 15, the middle sleeve 442 can serve as a spacer to inhibit contact between the distal end of the outer sleeve 443 and the distal end of the inner sleeve 441. The outer sleeve 443 can define a groove 458 and can have a bearing surface 460 such as for receiving a flexible cord or other mechanical coupling.

In use, when the mounting base 430 is fixedly attached to a structure and a force is applied (e.g., by a flexible cord) to the bearing surface 460 within the groove 458 at the distal end of the outer sleeve 443, that force will be transmitted by the transducer assembly 420 to the structure. In so doing, and in some proportion to the amount of the force, the distal end of the outer sleeve 443 can move laterally relative to the distal end of the inner sleeve 441, thereby resulting in movement of the Hall effect sensor 474 relative to the magnet 470. Monitoring a signal generated by the Hall effect sensor 474 (e.g., transmitted over wires 478) can reveal the amount of lateral movement, and the amount of force can be determined therefrom as will be appreciated. In this configuration, the thickness, material and shape of the distal end of the outer sleeve 443 can be selected based upon the intended force to be transmitted and measured by the transducer assembly 420, namely to provide sufficient strength though while still allowing for adequate deflection under load to facilitate measurement. Each of the features and alternative embodiments described with reference to the embodiments of FIGS. 1-12 are also specifically applicable to the embodiment of FIGS. 13-15. It will be appreciated, upon review of the various embodiments illustrated and described, that a transducer assembly in accordance with the present disclosure can be provided in any of a variety of suitable alternative configurations, yet still being within the scope of the disclosure provided herein.

In conventional applications, high precision force determinations often involve use of strain gauges which are glued or otherwise attached onto force-bearing structural members. Monitoring of changes in resistance of the strain gauges can reveal the amount of deflection and force associated with the structural members. Strain gauges can provide challenges in application because they can be difficult to position and attach, have a relatively large form factor, have a tendency to fail or be damaged easily, require relatively complex signal processing circuitry, require relatively significant power for operation, and are relatively expensive.

In the examples described herein, a transducer assembly can be designed to allow for deflections under load, such as by allowing lateral deflection of the collar. In this way and by allowing for deflection, the transducer assemblies as described herein can be analogous to conventional sensors involving a strain gauge configuration, but instead the measurement is accomplished through use of magnets and Hall effect sensors. Use of a Hall effect sensor in a transducer assembly can provide advantages as compared with use of a strain gauge. For example, while Hall effect sensors can be suitably used as described above, it can be difficult to obtain and/or reliably position a strain gauge into the very small spaces required of certain embodiments of the transducer assemblies as described herein (e.g., see FIG. 10). Also, while Hall effect sensors can be energy efficient and provide high level output signals, strain gauges require excessive energy and can require signal processing and/or amplification to reach suitable high levels. Furthermore, the transducer assemblies as described herein can be constructed through use of inexpensive, readily available, off-the-shelf Hall effect sensors (see e.g., FIG. 7).

More particularly, while Hall effect sensors can be used in a head on or slide by configuration, the illustrated embodiments employ use of a Hall effect sensor in a slide by configuration. The unique geometry of the transducer assembly configurations facilitate sliding of the magnet by and relative to the Hall effect sensor to represent forces associated with loads upon the transducer assemblies. In certain configurations of a transducer assembly as described herein, under normal intended loading of the transducer assembly, the amount of lateral deflection of the collar, and resulting slide by movement of the magnet relative to the Hall effect sensor, can be on the order of less than about 0.010 inch, less than about 0.005 inch, or less than about 0.001 inch. It will be appreciated that these are very small levels of deflection, not typically perceivable by the human eye, well within suitable parameters for reliable design, and normally experienced by typical components of a mechanical system. In other embodiments, it will be appreciated that a transducer assembly can involve use of a Hall effect sensor in a head on configuration.

In the above examples, the Hall effect sensor provides an output signal based upon movement of the magnetic field, resulting from relative movement between the magnet and the Hall effect sensor resulting from loading of the transducer assembly. The resulting output signal from the Hall effect sensor can be provided as a function of deflection and corresponding load. For example, a transducer assembly can be configured such that a Hall effect sensor provides a 0-6 volt output signal in response to a 0-150 pound load. In one embodiment, the output signal can be linear over this range, though in another embodiment associated circuitry can be suitably calibrated to account for any nonlinearity of the output signal. In this example, in a linear configuration, if an output signal of 3 volts is provided by the Hall effect sensor, associated circuitry can determine that 75 pounds of load is provided upon the transducer assembly.

It will be appreciated that a specific Hall effect sensor and magnet combination can be selected for a transducer assembly based upon engineering considerations involving: the intended loading, characteristics and environment of the transducer assembly; the desired strength and shape of the magnetic field produced by the magnet; the range, sensitivity and output signal configurations of the Hall effect sensor; the total effective gap (e.g., longitudinal spacing) between the Hall effect sensor and the magnet; and the desired monitoring circuitry to be employed.

A transducer assembly as described herein can be provided directly within a load path, thereby itself defining a load supporting member of the particular application. For example, in the arrangement of FIG. 10, the transducer assembly 120 serves as a lug for attachment of the flexible cord 196 to the cam 199 of an archery bow. It will be appreciated that, by providing a cam assembly of an archery bow with a transducer assembly, e.g., as shown in FIG. 10, operation of the archery bow can be effectively monitored as described in U.S. Pat. No. 10,281,229, issued on May 7, 2019, the entire disclosure of which is hereby incorporated by reference herein in its entirety. More particularly, a transducer assembly as described herein can be implemented in cam assemblies and archery bows to facilitate the monitoring systems and methods of U.S. Pat. No. 10,281,229. While FIG. 10 illustrates use of a transducer assembly in association with an archery bow, it will be appreciated that a transducer assembly as disclosed herein can be advantageously implemented in any of a variety of other suitable force measurement applications, such as by provision directly in a load path. For example, it will be appreciated that transducer assemblies as described herein can be used in any of a variety of applications other than archery bows, including for example, vehicles, manufacturing machinery, consumer goods, tools, cabling systems, and otherwise.

The foregoing description of embodiments and examples of the disclosure has been presented for purposes of illustration and description. It is not intended to be exhaustive or to limit the disclosure to the forms described. Numerous modifications are possible in light of the above teachings. Some of those modifications have been discussed and others will be understood by those skilled in the art. The embodiments were chosen and described in order to best illustrate the principles of the disclosure and various embodiments as are suited to the particular use contemplated. The scope of the disclosure is, of course, not limited to the examples or embodiments set forth herein, but can be employed in any number of applications and equivalent devices by those of ordinary skill in the art. Rather it is hereby intended the scope of the invention be defined by the claims appended hereto. Also, for any methods claimed and/or described, regardless of whether the method is described in conjunction with a flow diagram, it should be understood that unless otherwise specified or required by context, any explicit or implicit ordering of steps performed in the execution of a method does not imply that those steps must be performed in the order presented and may be performed in a different order or in parallel.

What is claimed is:

1. A transducer assembly comprising:
    a mounting base;
    a collar extending from a proximal end to a distal end, the collar defining a bore, the proximal end being fixedly coupled with the mounting base, and the distal end defining an opening;
    a magnet; and
    a Hall effect sensor; wherein
    one of the magnet and the Hall effect sensor is disposed within the bore and fixedly coupled to the mounting base;
    the other of the magnet and the Hall effect sensor is fixedly coupled to the distal end of the collar and disposed adjacent to the opening; and
    the Hall effect sensor is spaced longitudinally from the magnet and is configured to detect lateral deflection of the distal end of the collar.

2. The transducer assembly of claim 1 wherein the collar comprises an exterior groove.

3. The transducer assembly of claim 2 wherein the exterior groove comprises a concave bearing surface.

4. The transducer assembly of claim 3 wherein the collar comprises a sheave, and the sheave comprises the exterior groove.

5. The transducer assembly of claim 3 wherein the mounting base comprises a plurality of mounting apertures.

6. The transducer assembly of claim 1 wherein the other of the magnet and the Hall effect sensor is disposed within the opening.

7. The transducer assembly of claim 1 further comprising adhesive facilitating sealing of the opening.

8. The transducer assembly of claim 1 further comprising a pedestal, wherein:
    the pedestal is disposed within the bore and fixedly coupled to the mounting base; and
    the one of the magnet and the Hall effect sensor is fixedly coupled to the pedestal.

9. The transducer assembly of claim 8 defining an annular gap extending:
    laterally between the pedestal and the collar; and
    longitudinally from the proximal end toward the distal end.

10. The transducer assembly of claim 9 wherein the collar and the pedestal are concentrically disposed while extending longitudinally from the proximal end toward the distal end.

11. The transducer assembly of claim 8 wherein the mounting base, the pedestal, and the collar are integrally formed as a unitary structure.

12. The transducer assembly of claim 1 wherein the mounting base and the collar are integrally formed as a unitary structure.

13. The transducer assembly of claim 12 wherein the magnet is fixedly coupled with the mounting base.

14. The transducer assembly of claim 13 further comprising adhesive securing the Hall effect sensor to the distal end of the collar, wherein at least part of the Hall effect sensor is disposed within the bore.

15. The transducer assembly of claim 13 further comprising a circuit board, a capacitor, and adhesive, wherein:
    the Hall effect sensor is mounted to the circuit board;
    the capacitor is mounted to the circuit board; and
    the adhesive secures the circuit board to the distal end of the collar.

16. The transducer assembly of claim 15 wherein at least part of the circuit board is disposed within the bore.

17. A transducer assembly comprising:
    a mounting base;
    a collar extending from a proximal end to a distal end, the collar defining a bore, the proximal end being fixedly coupled with the mounting base;
    a magnet;
    a Hall effect sensor; and
    at least one wire coupled with the Hall effect sensor, wherein:
    one of the magnet and the Hall effect sensor is disposed within the bore and fixedly coupled to the mounting base;
    the other of the magnet and the Hall effect sensor is fixedly coupled to the distal end of the collar;
    the Hall effect sensor is spaced longitudinally from the magnet and is configured to detect lateral deflection of the distal end of the collar;
    the mounting base and the collar are integrally formed as a unitary structure;
    the mounting base defines an aperture extending through the mounting base and into the bore; and
    the at least one wire passes through the aperture.

18. The transducer assembly of claim 17 wherein the Hall effect sensor is fixedly coupled with the mounting base.

19. A transducer assembly comprising:
    a mounting base and a collar integrally formed as a unitary structure, the collar extending from a proximal end to a distal end, the collar defining a bore, the proximal end being fixedly coupled with the mounting base;
    a magnet fixedly coupled to the distal end of the collar;
    a circuit board;
    a capacitor mounted to the circuit board;
    a Hall effect sensor mounted to the circuit board; and
    an adhesive securing the circuit board to the mounting base such that the Hall effect sensor is disposed within the bore, fixedly coupled with the mounting base, spaced longitudinally from the magnet, and configured to detect lateral deflection of the distal end of the collar.

20. The transducer assembly of claim 19 further comprising adhesive securing the magnet to the distal end of the collar, wherein at least part of the magnet is disposed within the bore.

21. A method comprising:
fixedly positioning a mounting base of a transducer assembly, wherein the transducer assembly comprises a magnet and a Hall effect sensor spaced longitudinally from the magnet;
providing power to the Hall effect sensor;
routing a flexible cord in contact with and at least partially around a circumference of a collar of the transducer assembly, the collar extending from a proximal end to a distal end, the collar defining a bore, the proximal end being fixedly coupled with the mounting base, one of the magnet and the Hall effect sensor being disposed within the bore and fixedly coupled to the mounting base, and the other of the magnet and the Hall effect sensor being fixedly coupled to the distal end of the collar;
applying a load to the flexible cord, resulting in lateral deflection of the distal end of the collar;
detecting, by the Hall effect sensor, the lateral deflection of the distal end of the collar;
producing, by the Hall effect sensor, an electrical signal indicative of the lateral deflection of the distal end of the collar; and
based upon the electrical signal, identifying an amount of the load applied to the flexible cord.

22. The method of claim 21 wherein the collar comprises an exterior groove having a concave bearing surface, and the routing comprises disposing a portion of the flexible cord into the exterior groove and in contact with the concave bearing surface.

23. The method of claim 21 further comprising passing at least one wire coupled with the Hall effect sensor through an aperture, wherein the aperture extends through the mounting base and into the bore.

24. The method of claim 21 wherein:
the mounting base and the collar are integrally formed as a unitary structure; and
the magnet is fixedly coupled with the mounting base.

* * * * *